United States Patent [19]

Nagasaka et al.

[11] Patent Number: 5,219,709

[45] Date of Patent: Jun. 15, 1993

[54] PHOTOPOLYMERIZABLE COMPOSITION

[75] Inventors: Hideki Nagasaka, Yamato; Katsuko Ohta, Yokohama, both of Japan

[73] Assignee: Mitsubishi Kasei Corporation, Tokyo, Japan

[21] Appl. No.: 841,495

[22] Filed: Feb. 26, 1992

[51] Int. Cl.$^5$ .............................................. G03F 7/031
[52] U.S. Cl. .................................. 430/281; 430/914; 430/920; 522/26
[58] Field of Search ....................... 430/281, 914, 920; 522/26

[56] References Cited

U.S. PATENT DOCUMENTS 3,987,037  10/1976  Bonham et al. .
4,997,745   3/1991  Kawamura et al. .
5,147,758   9/1992  Smothers et al. ............... 430/281

FOREIGN PATENT DOCUMENTS 0341720  11/1989  European Pat. Off. .
0379200   7/1990  European Pat. Off. ............. 430/914
0437259   7/1991  European Pat. Off. .

Primary Examiner—Marion E. McCamish
Assistant Examiner—Christopher D. RoDee
Attorney, Agent, or Firm—Oblon, Spivak, McClelland, Maier & Neustadt

[57] ABSTRACT

A photopolymerizable composition comprising an addition polymerizable ethylenically unsaturated compound and a photopolymerization initiator system, wherein the photopolymerization initiator system comprises:

(a) a squarylium dye containing a following formula (I),

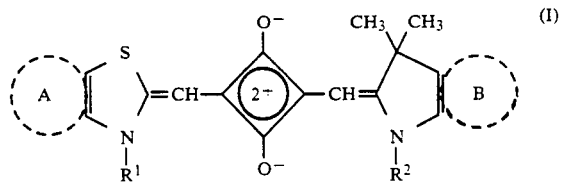

wherein each of $R^1$ and $R^2$ is a substituted or unsubstituted alkyl group or aryl group, and each of A and B is a substituted or unsubstituted benzene ring or naphthalene ring, and (b) a s-triazine compound having at least one halogenated methyl group.

12 Claims, No Drawings

PHOTOPOLYMERIZABLE COMPOSITION

The present invention relates to a photopolymerizable composition. Particularly, it relates to an improved photopolymerizable composition showing a high sensitivity to light rays in a long wavelength range.

Heretofore, a number of image forming methods have been known in which a photopolymerizing system is utilized. For example, there are a method wherein a photopolymerizable composition comprising an addition polymerizable compound containing an ethylenic double bond and a photopolymerization initiator, and optionally as an additional component an organic polymer binder, is prepared, this photopolymerizable composition is coated on a substrate to obtain a photosensitive material provided with a layer of the photopolymerizable composition, exposure of a desired image is conducted so that the exposed portion is polymerized and cured, and the unexposed portion is then dissolved and removed to form a cured relief image; a method wherein a change in the bonding strength is created by the radiation, and then the substrate is peeled off to form an image; and a method wherein an image is formed by utilizing a change in the adhesion of a toner caused by radiation to a layer of a photopolymerizable composition. As the photopolymerization initiator of the photopolymerizable composition used in these methods, benzoin, benzoin alkyl ether, benzil ketal, benzophenone, anthraquinone, benzil or Michler's ketone has been employed. These photopolymerization initiators have an ability to initiate photopolymerization with light rays of short wavelength in the ultraviolet light range of at most 400 nm.

In recent years, with the progress of image-forming techniques, there has been a strong demand for photopolymers highly sensitive to light rays in the visible light range. For example, a plate making system employing an oscillation beam of 488 nm of an argon ion laser is considered to be one of the most prospective techniques. Accordingly, a number of photopolymerization initiator systems having the sensitivity range extended to about 500 nm, have been proposed. Further, recently, a study of a photoinitiator system corresponding to light rays of a long wavelength exceeding 600 nm, has been active. One of the applied techniques thereof is a laser plate making by means of a He-Ne laser or a semiconductor laser, and another application is a technique for reproducing a full color image by means of a photopolymerization system.

With respect to the latter, there has been a disclosure as old as Japanese Examined Patent Publication No. 41346/1971. According to the disclosure, three-layers having dispersed, respectively, in gelatin layers, small droplet-like polymerizable compositions containing photopolymerizable initiators and color couplers corresponding to blue, green and red lights, respectively, were coated to form a photosensitive layer. Then, color image light rays are irradiated, followed by treatment with color-developing solutions, whereby non-cured portions are color-developed to obtain a full color image. Further, an applied technique wherein this concept is combined with a technique of a pressure sensitive color-development by means of microcapsules, has also been proposed. For example, such a disclosure is found in Japanese Unexamined Patent Publication No. 143044/1987. According to the publication, a photopolymerizable composition comprising photopolymerization initiators sensitive to the respective three color light rays and the respective leuco dyes, is filled in microcapsules and coated on a sheet. This coated sheet is exposed to color image light rays, and the capsules at the non-cured portions are pressed and broken on a color-developing sheet, and transferred to develop yellow, magenta and cyan colors to obtain a full color image.

One of the requirements in the above-mentioned laser plate making and in the technique for reproducing a full color image, is to improve the sensitivity of the photosensitive material to light rays of a long wavelength, particularly in a range exceeding about 600 nm. Further, the dissolution stability of the photopolymerization initiator system in the photosensitive material and proper spectral sensitivity especially in the full color-reproducing technique, are required. We have previously proposed a photopolymerization initiator system composed of a combination of a squarylium dye and a certain specific triazine compound, but its dissolution stability and spectral sensitivity are not necessarily adequate. The present invention has been accomplished as a result of extensive researches to overcome such problems. Accordingly, it is an object of the present invention to provide a photopolymerization initiator system which is highly sensitive to light rays of a long wavelength, particularly in a range of from 600 to 700 n and which has excellent dissolution stability and good spectral sensitivity characteristics.

We have found it possible to solve the above-mentioned problems by a system which is a combination of a squarylium dye having a specific structure and a striazine compound.

Thus, the present invention provides a photopolymerizable composition comprising an addition polymerizable ethylenically unsaturated compound and a photopolymerization initiator system, wherein the photopolymerization initiator system comprises:

(a) a squarylium dye containing a following formula (I),

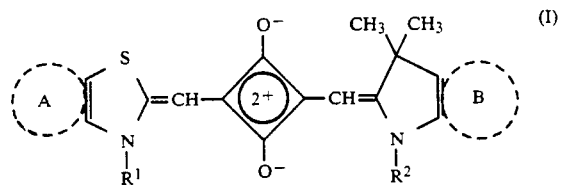

wherein each of $R^1$ and $R^2$ is a substituted or unsubstituted alkyl group or aryl group, and each of A and B is a substituted or unsubstituted benzene ring or naphthalene ring, and (b) a s-triazine compound having at least one halogenated methyl group.

Now, the present invention will be described in detail with reference to the preferred embodiments.

The addition polymerizable compound having at least one ethylenically unsaturated double bond (hereinafter referred to simply as "ethylenic compound") contained as a first essential component in the photopolymerizable composition of the present invention is a compound having an ethylenically unsaturated double bond, which is capable of undergoing addition polymerization and being cured by the action of the photopolymerization initiator system as a second essential component, when the photopolymerizable composition is irradiated with active light rays. For example, it may be a monomer having such a double bond or a polymer having an ethylenically unsaturated double bond in its side chain or main chain. In the present invention, the monomer is meant for a substance as opposed to a so-called polymer substance and includes dimers, trimers and oligomers in addition to monomers in a narrow sense.

The monomer having an ethylenically unsaturated double bond includes, for example, an unsaturated carboxylic acid, an ester thereof with a monohydroxy compound, an ester of an unsaturated carboxylic acid with an aliphatic polyhydroxy compound, an ester of an unsaturated carboxylic acid with an aromatic polyhydroxy compound and an ester obtained by the esterification reaction of an unsaturated carboxylic acid and a polybasic carboxylic acid with a polyhydroxy compound such as the above-mentioned aliphatic polyhydroxy compound or aromatic polyhydroxy compound.

The above-mentioned ester of an unsaturated carboxylic acid with an aliphatic polyhydroxy compound is not particularly limited and includes, as specific examples, acrylic acid esters such as ethylene glycol diacrylate, triethylene glycol diacrylate, trimethylolpropane triacrylate, trimethylolethane triacrylate, pentaerythritol diacrylate, pentaerythritol triacrylate, pentaerythritol tetracrylate, dipentaerythritol tetracrylate, dipentaerythritol pentacrylate, dipentaerythritol hexacrylate and glycerol acrylate; methacrylic acid esters corresponding to the above examples wherein "acrylate" is changed to "methacrylate"; itaconic acid esters corresponding to the above examples wherein "acrylate" is likewise changed to "itaconate"; crotonic acid esters corresponding to the above examples wherein "acrylate" is likewise changed to "crotonate"; and maleic acid esters corresponding to the above examples wherein "acrylate" is likewise changed to "maleate".

The ester of an unsaturated carboxylic acid with an aromatic polyhydroxy compound includes, for example, hydroquinone diacrylate, hydroquinone dimethacrylate, resorcinol diacrylate, resorcinol dimethacrylate and pyrogallol triacrylate.

The ester obtained by the esterification reaction of an unsaturated carboxylic acid and a polybasic carboxylic acid with a polyhydroxy compound may not necessarily be a single compound. Typical specific examples include a condensation product of acrylic acid, phthalic acid and ethylene glycol, a condensation product of acrylic acid, maleic acid and diethylene glycol, a condensation product of methacrylic acid, terephthalic acid and pentaerythritol and a condensation product of acrylic acid, adipic acid, butane diol and glycerol.

Other ethylenic compounds which may be used in the present invention include, for example, acrylamides such as ethylene bisacrylamide; allyl esters such as diallyl phthalate; and vinyl group-containing compounds such as divinyl phthalate.

The polymer having an ethylenically unsaturated double bond on the main chain includes, for example, a polyester obtained by the polycondensation reaction of an unsaturated dibasic carboxylic acid with a dihydroxy compound, and a polyamide obtained by the polycondensation reaction of an unsaturated dibasic carboxylic acid with a diamine. The polymer having an ethylenically unsaturated double bond at the side chain may be a condensation polymer of a dibasic carboxylic acid having an unsaturated bond at the side chain such as itaconic acid, propylidenesuccinic acid or ethylidenemalonic acid with a dihydroxy or diamine compound. Further, a polymer having a functional group having a reactivity such as a hydroxyl group or a halogenated methyl group in the side chain, such as a polymer obtained by a polymer reaction of e.g. polyvinyl alcohol, poly(2-hydroxyethyl methacrylate) or polyepichlorohydrin with an unsaturated carboxylic acid such as acrylic acid, methacrylic acid or crotonic acid, may also be suitable for use.

Among the above-mentioned ethylenic compounds, monomers of acrylic acid esters or methacrylic acid esters are particularly suitable for use.

Now, the photopolymerization initiator system as a second essential component of the photopolymerizable composition of the present invention will be described.

The photopolymerization initiator system of the present invention is a combination of two components. The first component (a) is a squarylium dye of the following formula (I):

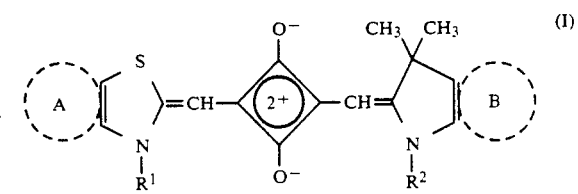

wherein each of $R^1$ and $R^2$ is a substituted or unsubstituted alkyl group or aryl group, and each of A and B is a substituted or unsubstituted benzene ring or naphthalene ring.

Most of conventional squarylium dyes do not have adequate solubility in a photosensitive layer and tend to deposit, and they thus have a drawback that it is thereby difficult to attain constant photosensitive properties. Further, many squarylium dyes are useful as sensitizers for light rays of from 600 to 700 nm i.e. for a red-color light. Therefore, they can be used as red sensitive materials for reproduction of full color images, but their spectral sensitivity characteristics are not necessarily adequate. This tendency is particularly remarkable with red sensitive materials intended for use at long wavelengths, because the sensitivity trails over to the undesired short wavelength side. For example, in the case of a red-sensitive material, undesired photosensitivity occurs in a region of from 500 to 600 nm. Consequently, color reproducibility deteriorates. As a parameter for evaluating such spectral sensitivity characteristics, in the case of red sensitive materials, the ratio of the sensitivity for 650 nm to the sensitivity for 550 nm can be used for the evaluation. Namely, the greater the value of this ratio, the better the spectral sensitivity characteristics, consequently the better the color reproducibility. This value will be hereinafter referred to simply as the spectral sensitivity value.

With conventional squarylium dyes, it has been difficult to satisfy both of the dissolution stability and the spectral sensitivity characteristics. Whereas, we have discovered that the dye of the above formula (I) has satisfactory properties in this respect.

In the above formula (I), each of $R^1$ and $R^2$ is an alkyl group, preferably a methyl group, an ethyl group, a n-propyl group, a n-butyl group, a n-hexyl group or a n-octyl group, or an aryl group, preferably a phenyl group or a naphthyl group. These groups may further have a substituent. As such a substituent, a phenyl group, a phenoxy group, a methoxy group or an ethoxy group is preferred.

Each of A and B is a substituted or unsubstituted benzene ring or naphthalene ring. As the substituent, an alkyl group such as a methyl group or an ethyl group; an alkoxy group such as a methoxy group or an ethoxy group; or a halogen atom such as chlorine or bromine, is preferred. The following compounds may be mentioned as preferred squarylium dyes which satisfy the above conditions. The symbol in the bracket ( ) is a symbol representing the compound

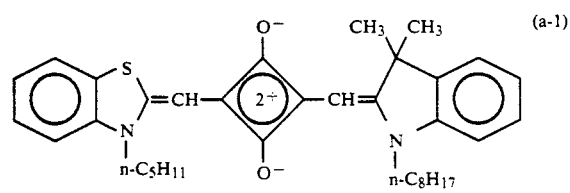
(a-1)

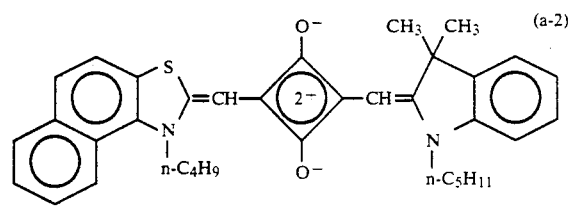
(a-2)

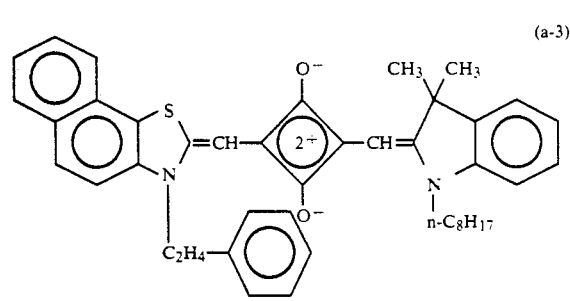
(a-3)

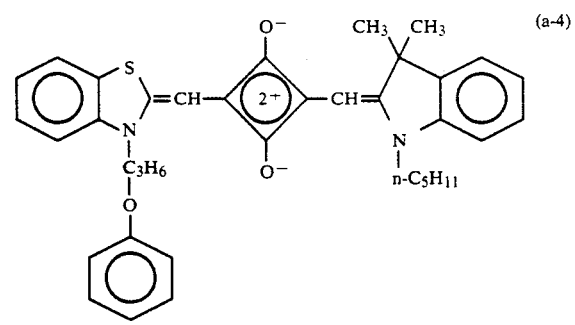
(a-4)

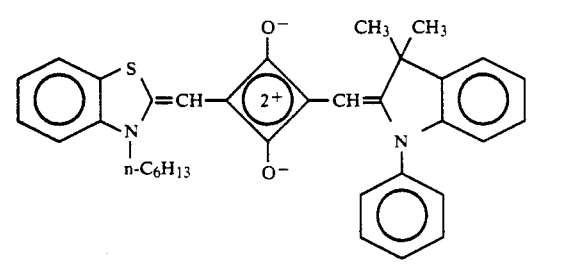

-continued

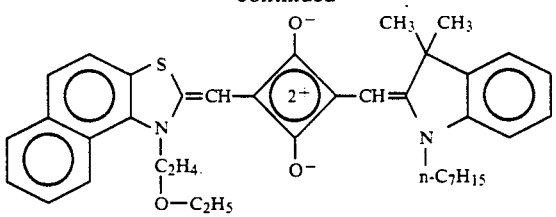

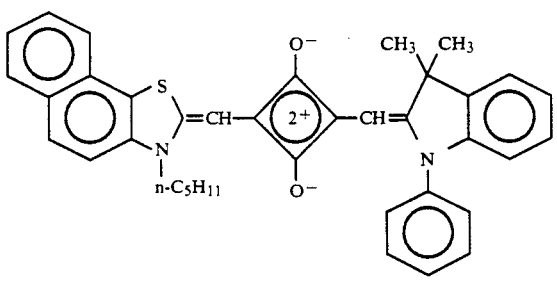

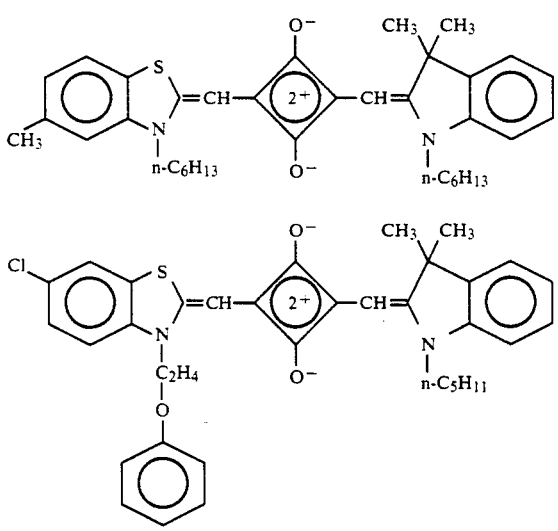

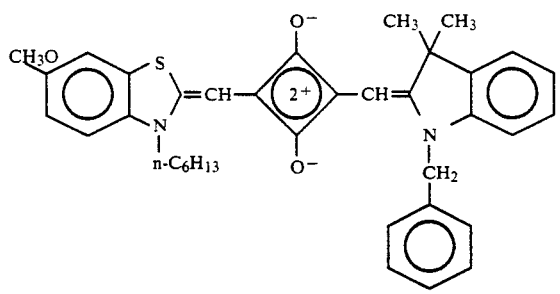

The squarylium dyes illustrated above, to be used in the present invention, can be prepared in a usual method, for example, by a method disclosed by H. E. Sprenger, Angew. Chem. internat Edit 6 553 (1967).

Now, the second component (b) constituting the photopolymerization initiator system of the present invention will be described.

The component (b) is a s-triazine derivative having at least one mono-, di- or tri-halogenated methyl group bonded to the s-triazine ring. It includes, for example, compounds disclosed by e.g. Wakabayashi et al, Bull. Chem. Soc. Japan, 42, 2924 (1969), in U.S. Pat. No. 3,987,037, or by F. C. Schaefer et al, J. Org. Chem., 29, 1527 (1964). Specific examples of such compounds will be given below. The letters in the bracket [] are the reference symbols for the respective compounds, which will be referred to hereinafter. Such compounds include, for example, 2,4,6-tris(trichloromethyl)-s-triazine [b-1], 2-methyl-4,6 bis(trichloromethyl)-s-triazine [b-2], 2-phenyl-4,6-bis(trichloromethyl)-s-triazine, 2-(p-chlorophenyl)-4,6-bis(trichloromethyl)-s-triazine, 2-phenylthio-4,6-bis(trichloromethyl)-s-triazine [b-3], 2-benzylthio-4,6-bis(trichlormethyl)-s-triazine [b-4], 2-(p-tolyl)-4,6-bis(trichloromethyl)-s-triazine [b-5], 2-(p-methoxyphenyl)-4,6-bis(trichloromethyl)-s-triazine, 2-n-propyl-4,6-bis(trichloromethyl)-s-triazine, 2-($\alpha,\alpha,\beta$-trichloroethyl)-4,6-bis(trichloromethyl)-s-triazine, 2-styryl-4,6-bis(trichloromethyl)-s-triazine, 2,4,6-tris(dichloromethyl)-s-triazine, 2,4,6-tris(monochloromethyl)-s-triazine, 2-(p-methoxystyryl)-4,6-bis(trichloromethyl)-s-triazine, 2,4,6-tris(tribromomethyl)-s-triazine [b-6], 2-methyl-4,6-bis(tribromomethyl)-s-triazine, 2,4,6-tris(dibromomethyl)-s-triazine or 2-methoxy-4,6-bis(tribromomethyl)-s-triazine. Among them, particularly preferred are s-triazines containing at least two trichloro or tribromo methyl groups, such as 2,4,6-tris(trichloromethyl)-s-triazine, 2-phenyl-4,6-bis(trichloromethyl)-s-triazine, 2-methyl-4,6-bis(trichloromethyl)-s-triazine, 2-phenylthio-4,6-bis(trichloromethyl)-s-triazine and 2,4,6-tris(tribromomethyl)-s-triazine. These s-triazines can be prepared either by reacting the corresponding nitrile compounds with aluminium bromide in the presence of hydrogen chloride or via the corresponding imidates, in accordance with the above identified literatures.

The photopolymerization initiator of the present invention is capable of providing remarkable effects only by the combination of the above-mentioned two components (a) and (b). The two components are used preferably in a weight ratio of (a) to (b) within a range of from 1:30 to 10:1, more preferably within a range of from 1:15 to 4:1. The photopolymerization initiator system contained in the photopolymerization composition of the present invention, i.e. the total amount of the components (a) and (b), is preferably within a range of from 0.1 to 30% by weight, more preferably from 0.5 to 20% by weight, relative to the above-mentioned ethylenic compound.

The photopolymerizable composition of the present invention may contain, in addition to the above described respective constituting components, other substances depending upon its particular purpose.

For example, when a film-forming ability or a viscosity controlling ability is required, an organic polymer substance may be added as a binder. For example, a homopolymer or copolymer of e.g. (meth)acrylic acid, an ester thereof, maleic acid, acrylonitrile, styrene, vinyl acetate or vinylidene chloride, as well as polyethylene oxide, polyvinylpyrrolidone, polyamide, polyurethane, polyethylene terephthalate isophthalate, acetyl cellulose or polyvinyl butyral, may be mentioned. Such a binder may be incorporated in an amount within a range of not more than 500% by weight, preferably not more than 200% by weight, relative to the above ethylenic compound.

Further, additives including a thermal polymerization inhibitor such as hydroquinone, p-methoxyphenol or 2,6-di-t-butyl-p-cresol; a coloring agent such as an organic or inorganic dyestuff or pigment; a plasticizer such as dioctyl phthalate, dodecyl phthalate, tricrezyl phosphate, dioctyl adipate or triethylene glycol dicaprylate and a sensitivity improving agent such as a tertiary amine or a thiol, may be added.

When the composition of the present invention is applied to the technique for reproducing a color image, a colorant precursor such as a color-forming material used in a conventional color photographic film as disclosed in Japanese Examined Patent Publication No. 41346/1971 or a leuco colorant well known in the technical field of pressure sensitive copying paper, may be incorporated. The leuco colorant includes, for example, a triarylmethane, bisarylmethane, a xanthene compound, a fluoran, thiazine compound and compounds having a lactone, lactum, sultone or spiropyran structure as a part of their structures.

Preferred amounts of the above-mentioned various additives are at most 2% by weight of the thermal polymerization inhibitor, at most 20% by weight of the coloring agent, at most 40% by weight of the plasticizer and at most 40% by weight of the colorant precursor, relative to the solid content of the photopolymerizable composition.

The type of a light sensitive material prepared by using the composition of the present invention, can suitably be selected depending upon the particular purpose.

For example, it is possible to select various types including a type wherein the composition is coated on e.g. a polymer sheet, a paper sheet or a metal sheet and dried, and if necessary, an overcoat layer may be provided as an upper layer to shield oxygen off, a type wherein a plurality of sensitive materials dispersed in different phase media in the form of small droplets, are coated in a plurality of layers, and a type wherein the composition is encapsulated in microcapsules and coated on a sheet.

There is no particular restriction as to the light source for radiation applicable to the composition of the present invention. A commonly employed light source containing visual light rays of at least 600 nm may suitably be used, such as a carbon arc, a high pressure mercury lamp, a xenone lamp, a metal halide lamp, a fluorescent lamp, a tungsten lamp, a halogen lamp, a helium-neon laser or a semiconductor laser.

Now, the present invention will be described in further detail with reference to Examples and Comparative Examples. However, it should be understood that the present invention is by no means restricted by these specific Examples.

The symbols for squarylium dyes and s-triazines used in Examples and Comparative Examples are those indicated hereinabove and those for the following compounds:

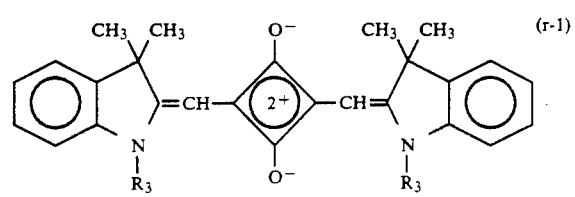

-continued

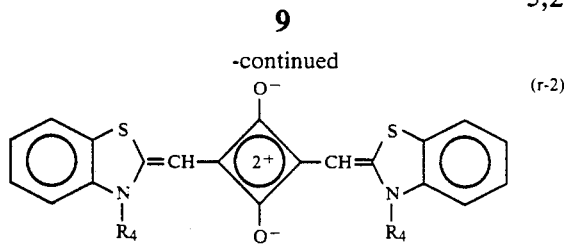
(r-2)

EXAMPLES 1 to 8 and COMPARATIVE EXAMPLES 1 to 4

The dissolution stability and the spectral sensitivity value as evaluation items represent the results of evaluation conducted in accordance with the following methods, respectively.

Dissolution stability

Under this item, the degree of dissolution stability was evaluated. Into pentaerythritol triacrylate, 1% by weight of a squarylium dye and 5% by weight of a s-triazine compound were added and dissolved under heating, and then the solution was left to stand at room temperature. Upon expiration of one month, evaluation was made under the following standards:

Good: No precipitation of the above additives was observed.
Fair: Precipitation was slight.
Poor: Precipitation of crystals was remarkable.

Spectral sensitivity value

Under this item, the red-color spectral sensitivity characteristics were evaluated. 2 g of a methyl methacrylate/methacrylic acid copolymer (weight average molecular weight: 45,000, copolymerization ratio: 85/12) and 8 g of pentaerythritol triacrylate were dissolved in 120 g of methyl ethyl ketone to obtain a photosensitive stock solution. This stock solution was divided, and to each divided solution, 1% by weight (based on solid content) of a squarylium dye and 5% by weight (based on solid content) of a s-triazine, as identified in Table 1, were added to obtain a sample photosensitive solution. Each photosensitive solution was whirl-coated on a grained and anodized aluminum sheet so that the dried film thickness would be 1.6 μm, followed by drying at 70° C. for 3 minutes.

On its surface, an aqueous polyvinyl alcohol solution was coated to form an overcoat layer having a dried film thickness of 3 μm, whereby a photosensitive test sample was obtained. Then, such a test sample was exposed for a predetermined period of time by means of a spectral radiation apparatus (RM-23-I, manufactured by Narumi K.K.) and then developed by a developing solution (an aqueous solution containing 9% by weight of butyl cellosolve and 1% by weight of sodium silicate), whereby photocuring rates at various wavelengths were obtained. The spectral sensitivity value here represents the value for a red-color light i.e. the value obtained as the ratio of the photocuring rate with light rays of 650 nm to the photocuring rate with light rays of 550 nm. This value shows the sensitivity for the red-color light as compared with the sensitivity trailing over to the short wavelength side thereof. The greater the value, the better the spectral sensitivity. As is evident from Table 1, the photopolymerization initiator system of the present invention is provided with good solubility and spectral sensitivity characteristics at the same time.

TABLE 1

|  | Squarylium dye | s-Triazine | Dissolution stability | Spectral sensitivity value |
|---|---|---|---|---|
| Example 1 | a-1 | b-1 | Good | 3.4 |
| Example 2 | a-2 | b-1 | Good | 4.1 |
| Example 3 | a-3 | b-1 | Good | 4.3 |
| Example 4 | a-4 | b-1 | Good | 3.5 |
| Example 5 | a-1 | b-2 | Good | 3.4 |
| Example 6 | a-2 | b-2 | Good | 4.0 |
| Example 7 | a-3 | b-3 | Good | 4.2 |
| Example 8 | a-3 | b-4 | Good | 4.1 |
| Comparative Example 1 | r-1($R_3 = CH_3-$) | b-1 | Fair | 2.2 |
| Comparative Example 2 | r-1($R_3 = C_5H_{11}-$) | b-1 | Good | 2.0 |
| Comparative Example 3 | r-2($R_4 = C_7H_{15}-$) | b-1 | Poor | 3.0 |
| Comparative Example 4 | r-2($R_4 = \phi-C_2H_4-$) | b-1 | Poor | 3.2 |

EXAMPLES 9 to 11 and COMPARATIVE EXAMPLES 5 and 6

A photosensitive material was prepared in the same manner as in Example 1, and the photocuring rate with a light of 650 nm was obtained in the same manner as in Example 1. For the purpose of comparison, a relative sensitivity was obtained using 1% by weight of a known high sensitivity initiator (std) as a standard, and the results are shown in Table 2.

TABLE 2

(std)
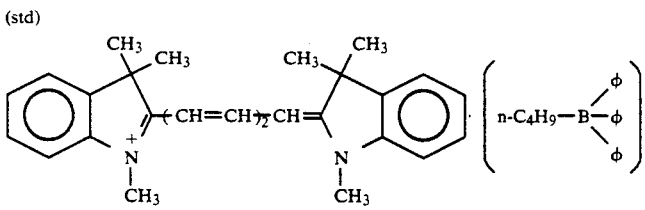

|  | Squarylium dye | s-Triazine | Relative sensitivity |
|---|---|---|---|
| Example 9 | a-1 | b-1 | 1.42 |
| Example 10 | a-2 | b-1 | 1.55 |
| Example 11 | a-3 | b-1 | 1.53 |
| Comparative Example 5 | r-1($R_3=CH_3-$) | b-1 | 1.10 |
| Comparative | Initiator std |  | 1.00 |

TABLE 2-continued (std)

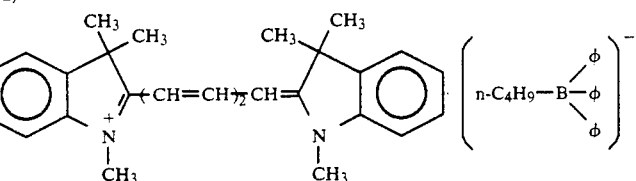

| | Squarylium dye | s-Triazine | Relative sensitivity |
|---|---|---|---|
| Example 6 | | | |

As described in the foregoing, according to the present invention, it is possible to obtain a photopolymerizable composition which exhibits excellent sensitivity particularly to a light having a wavelength of from 600 to 700 nm and which at the same time has excellent storage stability.

We claim:

1. A photopolymerizable composition comprising an addition polymerizable ethylenically unsaturated compound and a photopolymerization initiator system, wherein the photopolymerization initiator system comprises:
   (a) a squarylium dye containing a following formula (I),

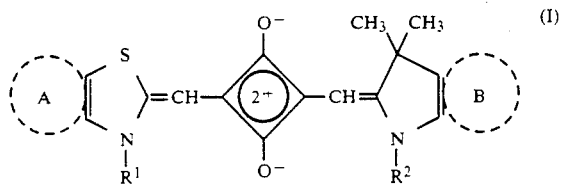

wherein each of $R^1$ and $R^2$ is a substituted or unsubstituted alkyl group or aryl group, and each of A and B is a substituted or unsubstituted benzene ring or naphthalene ring, and
   (b) a s-triazine compound having at least one halogenated methyl group.

2. The photopolymerizable composition according to claim 1, wherein the ethylenically unsaturated compound is an ethylenically unsaturated carboxylic acid ester.

3. The photopolymerizable composition according to claim 1, wherein the ethylenically unsaturated compound is a monomer of an acrylic acid ester or a methacrylic acid ester.

4. The photopolymerizable composition according to claim 1, wherein each of $R^1$ and $R^2$ is a methyl group, an ethyl group, a n-propyl group, a n-butyl group, a n-hexyl group, a n-octyl group, a phenyl group, and a naphthyl group.

5. The photopolymerizable composition according to claim 1, wherein the s-triazine compound is a s-triazine compound having at least two groups selected from the group consisting of a trichloromethyl group, a tribromomethyl group and a combination thereof.

6. The photopolymerizable composition according to claim 5, wherein the s-triazine compound is 2,4,6-tris(trichloromethyl)-s-triazine, 2-phenyl-4,6-bis(trichloromethyl)-s-triazine, 2-methyl-4,6-bis(trichloromethyl)-s-triazine, 2-phenylthio-4,6-bis(trichloromethyl)-s-triazine or 2,4,6-tris(tribomomethyl)-s-triazine.

7. The photopolymerizable composition according to claim 1, wherein the weight ratio of the squarylium dye to the s-triazine compound is within a range of from 1:30 to 10:1.

8. The photopolymerizable composition according to claim 1, which contains an organic polymer material as a binder.

9. The photopolymerizable composition according to claim 1, which contains at least one member selected from the group consisting of a thermal polymerization inhibitor, a coloring agent, a sensitivity-improving agent and a plasticizer.

10. The photopolymerizable composition according to claim 1, which contains a colorant precursor.

11. The photopolymerizable composition according to claim 1, wherein in the squarylium dye B is a benzene ring and $R^1$, $R^2$ and A are as defined in claim 1.

12. The photopolymerizable composition according to claim 11, wherein each of $R^1$ and $R^2$ is a methyl group, an ethyl group, a n-propyl group, a n-butyl group, a n-hexyl group, a n-octyl group, or a phenyl group.

* * * * *